United States Patent [19]
Ozawa

[11] Patent Number: 5,929,977
[45] Date of Patent: Jul. 27, 1999

[54] EXPOSURE APPARATUS AND EXPOSURE QUANTITY CONTROL METHOD

[75] Inventor: Ken Ozawa, Tokyo, Japan

[73] Assignee: Nikon Corporation, Tokyo, Japan

[21] Appl. No.: 08/914,801

[22] Filed: Aug. 15, 1997

Related U.S. Application Data

[63] Continuation of application No. 08/623,779, Mar. 29, 1996, Pat. No. 5,659,383.

[30] Foreign Application Priority Data

Nov. 17, 1995 [JP] Japan ................................ 7-299478

[51] Int. Cl.⁶ .......................... G03B 27/42; G03B 27/52; G03B 27/54; G03B 27/72
[52] U.S. Cl. .............................. 355/53; 355/55; 355/67; 355/69; 355/71
[58] Field of Search ................................ 355/53, 55, 67, 355/68, 69, 71

[56] References Cited

U.S. PATENT DOCUMENTS

| | | | |
|---|---|---|---|
| 4,908,656 | 3/1990 | Suwa et al. ............................. | 355/53 |
| 4,970,546 | 11/1990 | Suzuki et al. .......................... | 355/53 |
| 5,097,291 | 3/1992 | Suzuki ................................... | 355/51 |
| 5,191,374 | 3/1993 | Hazama et al. ........................ | 355/43 |
| 5,291,240 | 3/1994 | Jain ....................................... | 355/53 |
| 5,473,412 | 12/1995 | Ozawa ................................... | 355/77 |
| 5,483,311 | 1/1996 | Sakakibara et al. ................... | 355/53 |
| 5,526,093 | 6/1996 | Takahashi et al. ..................... | 355/53 |
| 5,574,537 | 11/1996 | Ozawa ................................... | 355/71 |
| 5,581,324 | 12/1996 | Miyai et al. ............................ | 355/53 |
| 5,627,627 | 5/1997 | Suzuki ................................... | 355/68 |
| 5,677,757 | 10/1997 | Taniguchi et al. ..................... | 355/71 |
| 5,699,148 | 12/1997 | Shiozawa .............................. | 355/71 |
| 5,777,724 | 10/1996 | Suzuki ................................... | 355/68 |

FOREIGN PATENT DOCUMENTS

| | | |
|---|---|---|
| 6-20924 | 1/1994 | Japan . |
| 6-267826 | 9/1994 | Japan . |

Primary Examiner—Richard Moses
Assistant Examiner—Shival Virmani
Attorney, Agent, or Firm—Foley & Lardner

[57] ABSTRACT

The illuminance of illumination light from an exposure light source is switched over in a plurality of steps in an open loop control, whereby, when a plurality of shot areas on one substrate to be exposed to light are exposed to the light with various integrated exposure quantities, the exposure quantity with respect to each shot area is correctly controlled. Pulse illumination light from an excimer laser light source is attenuated by a rough energy adjuster and a fine energy adjuster and then illuminates a reticle, while the reticle and a wafer are scanned with respect to a projection optical system, such that a pattern of the reticle is successively transferred to individual shot areas on the wafer. When the extinction ratio of the rough energy adjuster is switched over in an open loop control, the illuminance on the image surface is measured by an illuminance fluctuation sensor so as to adjust, based on the result of this measurement, the illuminance on the image surface.

12 Claims, 7 Drawing Sheets

Fig. 8

EXPOSURE APPARATUS AND EXPOSURE QUANTITY CONTROL METHOD

This application is a continuation of application Ser. No. 08/623,779 filed on Mar. 29, 1996 now U.S. Pat. No. 5,659,383.

BACKGROUND OF THE INVENTION

1. Field of the Invention

The present invention relates to an exposure quantity control method for controlling the exposure quantity with respect to a photosensitive substrate in an exposure apparatus used in a lithography process for manufacturing, for example, a semiconductor device, a liquid crystal display device, an image pickup device (e.g., CCD), or a thin film magnetic head.

In particular, the present invention is preferably used when exposure quantity control is effected in a scanning exposure type projection exposure apparatus such as that of step and scan type in which, while a part of a pattern on a mask is projected onto a photosensitive substrate, the mask and the substrate are scanned in synchronization with each-other with respect to its projection optical system so as to successively transfer the pattern of the mask to individual shot areas on the substrate.

2. Related Background Art

The exposure apparatus is an apparatus which projects a desired pattern onto a photosensitive material (photoresist). Such an exposure apparatus is disclosed in U.S. Pat. Nos. 4,908,656 and 5,191,374.

SUMMARY OF THE INVENTION

The present invention relates to a scanning type exposure apparatus in which a mask (reticle) and a photoresist are exposed to light while being simultaneously scanned with respect to a projection optical system. Light emitted from a light source of this exposure apparatus is transmitted through a pattern formed on the mask so as to impinge on the photoresist. When such a scanning type exposure apparatus is used, test printing is performed before the aimed exposure operation. In the method of the present invention, at the time of test printing, the extinction ratio of the exposure light emitted from a pulse light source is selected from a plurality of extinction ratios and then the photoresist and mask are scanned. At the time of this scanning operation, a part of the exposure light is detected for each selected extinction ratio and then, based on the result of detection, the pulse light source is driven.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, an embodiment of the exposure quantity control method in accordance with the present invention will be explained with reference to drawings. Elements identical to each other will be referred to with marks identical to each other without repeating their overlapping explanations.

Figure 3:
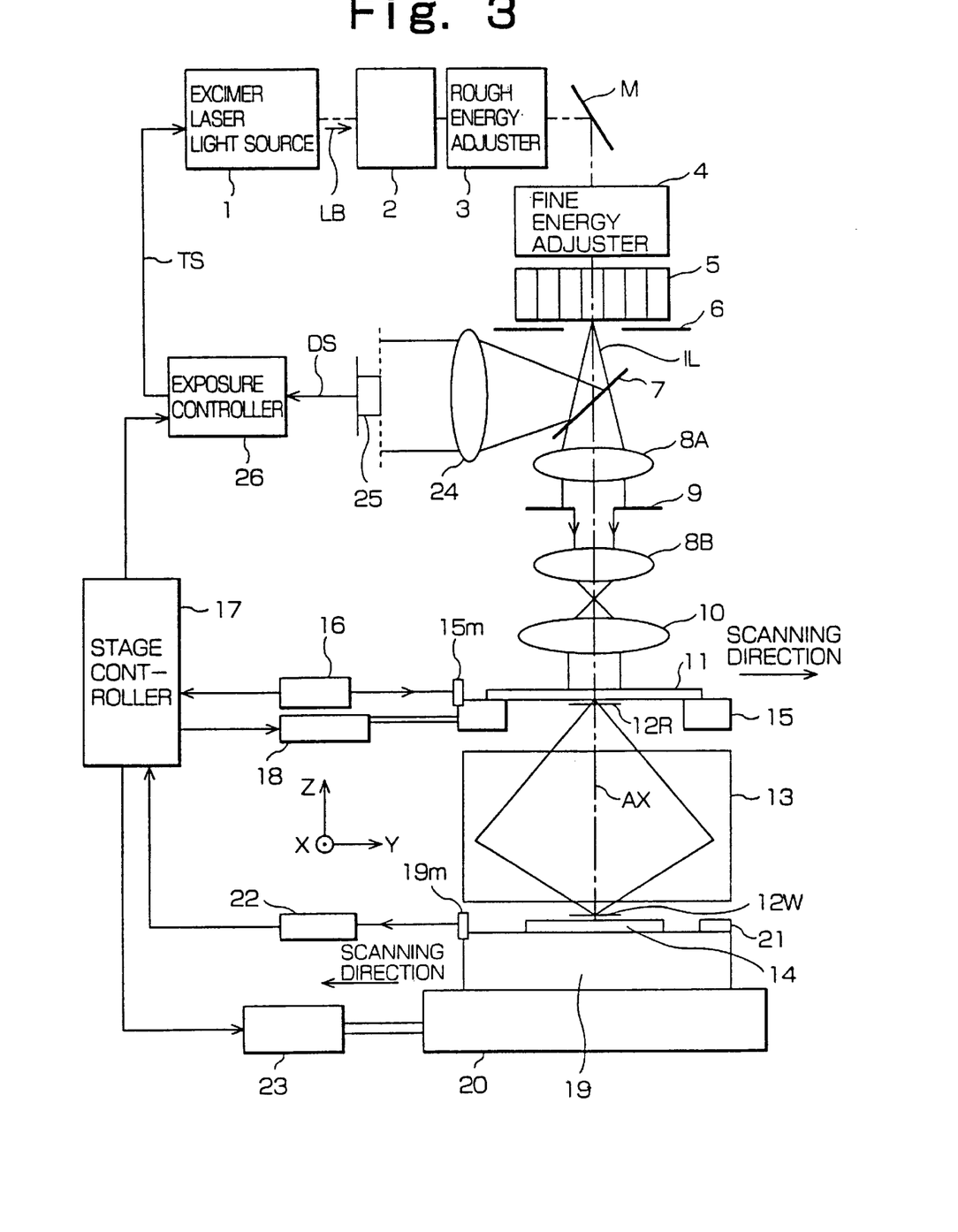
FIG. 3 is a configurational view showing a step and scan type projection exposure apparatus used in the above-mentioned embodiment.

FIG. 3 shows a step and scan type projection exposure apparatus (scanning type exposure apparatus). in accordance with this embodiment. The step and scan type projection exposure apparatus is an apparatus in which, while a part of a pattern of a reticle (mask) is projected onto a wafer by way of a projection optical system, the reticle and the wafer are scanned with respect to the projection optical system in synchronization with each other so as to successively transfer the pattern of the reticle to individual shot areas on the wafer under exposure light. In such a step and scan type projection exposure apparatus, without increasing the load on the projection optical system too much, a pattern having a larger area can be transferred with a high accuracy onto the wafer.

The exposure apparatus of this embodiment comprises a pulse laser light source 1 as its exposure light source. The pulse laser light source 1 is an excimer laser light source which emits a pulse laser beam LB in response to a trigger signal input thereto from an exposure controller 26. As the excimer laser light source 1, a KrF excimer laser light source (with an oscillation wavelength of 248 nm), an ArF excimer laser light source (with an oscillation wavelength of 193 nm), or the like is used. Alternatively, as the exposure light source, pulse light sources such as metal vapor laser light source and harmonic generator of YAG laser may be used.

The laser beam LB emitted in a pulse manner from the excimer laser light source 1 enters a beam shaping optical system 2 constituted by a cylinder lens, a beam expander, and the like, where the cross section of the beam is shaped so as to be efficiently incident on a fly-eye lens 5 subsequent thereto.

The laser beam LB emitted from the beam shaping optical system 2 successively enters a rough energy adjuster (optical attenuator) 3, an optical path bending mirror M, and a fine energy adjuster 4.

Figure 6A:
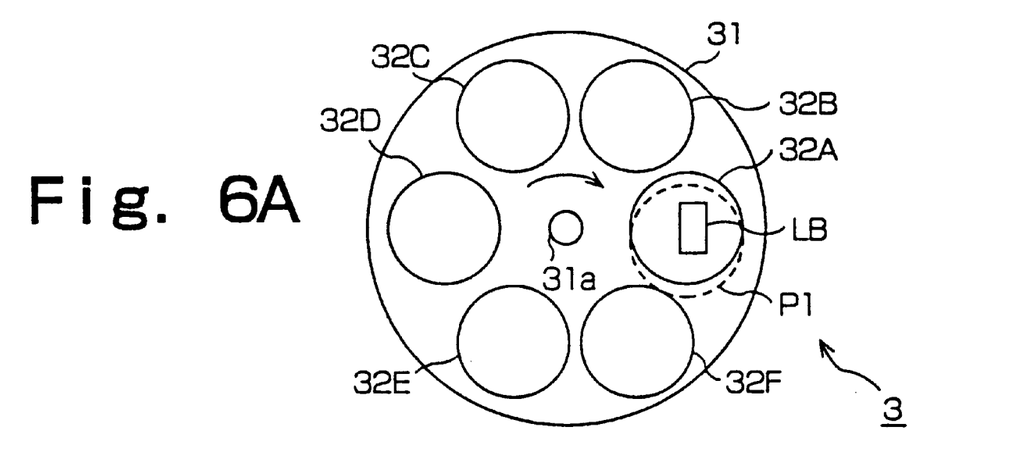
FIGS. 6A to 6C are explanatory views showing a case where reproducibility in transmissivity changes when the transmissivity of a rough adjustment unit (rough energy adjuster) is altered-in an open loop control.

As shown in FIG. 6A, the rough energy adjuster 3 has a plurality of ND filters 32A to 32F with extinction ratios (=1-transmissivity) different from each other disposed on a revolver 31. As this revolver 31 is rotated in an open loop control, the extinction ratios with respect to the incident laser beam LB can be roughly changed over in a plurality of steps. With respect to the configuration of this energy extinction device 3, the disclosure of U.S. Pat. No. 5,191,374 is incorporated herein by reference. Here, a revolver similar to the revolver 31 may be disposed thereon as a second stage such that the extinction ratio can be adjusted in a finer manner as these two sets of ND filters are combined together.

On the other hand, the fine energy adjuster 4 is constituted, for example, by two sheets of repeating pattern plates (double grating system) whose relative positions are variable. As the relative positions of these two sheets of repeating pattern plates are slightly shifted from each other, the extinction ratio with respect to the incident light can be continuously changed within a predetermined range. For example, the fine energy adjuster 4 is driven in an open loop control based on a control table in which the amount of control and the change in extinction ratio are related to each other. Since the extinction ratio is variable within a narrow range, the extinction ratio can be correctly set to a desired value even in the open loop control. With respect to the configuration of this energy extinction device 4, the disclosure of U.S. Pat. No. 5,191,374 is incorporated herein by reference.

Here, the energy adjuster 4 may be constituted, for example, by a glass plate (not depicted), which has a low reflection coating and is tilted with respect to the optical axis, and a rotation mechanism, which finely adjusts the angle of inclination of his glass plate, such that the extinction ratio is finely adjusted by means of the transmissivity characteristic of the coating with respect to the incident angle. Alternatively, the voltage applied to a high voltage power source of the excimer laser light source 1 may be slightly changed so as to alter the optical intensity of the laser beam LB, thereby substantially adjusting the extinction ratio with respect to the laser beam LB in a fine manner. In this case, the fine energy adjuster 4 can be eliminated. When the rough energy adjuster 3 and the fine energy adjuster 4 are used in combination, the extinction ratio (attenuation factor) with respect to the laser beam LB can be continuously controlled within a wide range.

The laser beam LB emitted from the fine energy adjuster 4 enters the fly-eye lens 5. The fly-eye lens 5 forms a plurality of secondary light sources so as to illuminate a reticle 11 subsequent thereto with a uniform illuminance distribution.

On the exit surface of the fly-eye lens 5, an aperture stop 6 of an illumination system is disposed.

A laser beam (pulse illumination light IL) emitted from the secondary light source 5 within the aperture stop 6 enters a beam splitter (optical separator device) 7. The reflectivity of the beam splitter 7 is smaller than the transmissivity thereof.

The pulse illumination light IL transmitted through the beam splitter 7 passes through a first relay lens 8A and then a rectangular aperture portion of a fixed irradiation stop (fixed reticle blind) 9. The fixed irradiation stop 9 in this embodiment is disposed at a position slightly defocused from the conjugate surface with respect to the pattern surface of the reticle 11. Also, though not depicted, a movable irradiation stop with variable position and width in the scanning direction is disposed on the conjugate surface with respect to the pattern surface of the reticle, such that the irradiation field is further restricted by means of this movable irradiation stop upon the start and stop of the scanning exposure operation so as to prevent unnecessary portions from being exposed to light.

The pulse illumination light IL transmitted through the fixed irradiation stop 9 illuminates, by way of a second relay lens 8B and a main condenser lens 10, a rectangular illumination area 12R on a reticle 11 held on a reticle stage 15 with a uniform illuminance distribution. An image in which the pattern within the illumination area 12R on the reticle 11 is reduced by a projection magnification $\beta$ (which is ¼ or ⅕, for example) by way of a projection optical system 13 is projected onto an irradiation field 12W on a wafer 14 which is coated with a photoresist. In the following explanations, it is assumed that Z axis is taken in parallel to an optical axis AX of the projection optical system, that the scanning direction (i.e., direction parallel to the paper surface of FIG. 3) of the reticle 11 with respect to the illumination area 12R within a plane perpendicular to this optical axis is Y direction, and that a non-scanning direction perpendicular to this scanning direction is X direction.

In this case, the reticle stage 15 is scanned in Y direction by a reticle stage driving section 18. The Y coordinate of the reticle stage 15 measured by a movable mirror 15m fixed on the reticle stage 15 and an external laser interferometer 16 is supplied to a stage controller 17, which controls, based on thus supplied coordinate, the position and velocity of the reticle stage 15 by way of the reticle stage driving section 18.

On the other hand, the wafer 14 is mounted on a Z tilt stage 19 by way of a non-depicted wafer holder. The Z tilt stage 19 is mounted on an XY stage 20. The XY stage 20 positions the wafer 14 in X and Y directions while scanning the wafer 14 in Y direction. The Z tilt stage 19 adjusts the position (focus position) of the wafer 14 in Z direction while having a function of adjusting the angle of inclination of the wafer 14 with respect to XY plane. The X and Y coordinates of the XY stage 20 measured by a movable mirror 19m fixed on the Z tilt stage 19 and an external laser interferometer 22 are supplied to the stage controller 17, which controls, based on thus supplied coordinates, the position and velocity of the XY stage 20 by way of a wafer stage driving section 23.

Also, the operations of the stage controller 17 are controlled by a non-depicted main control system which supervises and controls the whole apparatus. Then, at the time of scanning exposure, the reticle 11 is scanned by means of the reticle stage 15 in +Y direction (or −Y direction) with a velocity $V_R$ and, in synchronization therewith, the wafer 14 is scanned by means of the XY stage 20 in −Y direction (or +Y direction) with respect to the irradiation field 12W with a velocity $\beta \cdot V_R$ ($\alpha$ being the projection magnification from the reticle 11 to the wafer 14).

Further, a focus position detection system (not depicted) for detecting the focus position of the wafer 14 is provided. The stage controller 17 controls the operation of the Z tilt stage 19 in an autofocus manner such that the value measured by this focus position detection system is maintained at a predetermined value. In this case, when an offset is added to the value measured by the focus position detection system, the focus position of the wafer 14 can be changed to a desired position.

Also, an illuminance fluctuation sensor 21 composed of an opto-electric device is permanently disposed near the wafer 14 on the Z tilt stage 19 such that the light-receiving surface thereof is set to a height identical to that of the surface of the wafer 14. As the illuminance fluctuation sensor 21, a PIN type photodiode which is sensitive to a far ultraviolet region and has a high response frequency for detecting the pulse illumination light can be used, for example. The detection signal of the illuminance fluctuation sensor 21 is supplied to an exposure controller 26 by way of a peak hold circuit and an analog/digital (A/D) converter which are not depicted. In this case, while the excimer laser light source 1 is subjected to pulse emission, the XY stage 20 is driven so as to scan the light-receiving portion of the illuminance fluctuation sensor 21 in X and Y directions on the irradiation field 12W. As the exposure controller 26 determines the fluctuation in detection signals of the illuminance fluctuation sensor 21, the fluctuation in illuminance on the irradiation field 12W is measured.

In FIG. 3, the pulse illumination light IL reflected by the beam splitter 7 is received, by way of a condenser lens 24, by an integrator sensor 25 composed of an opto-electric device (photodetector). Detection signal DS of the integrator sensor 25 is supplied to the exposure controller 26 by way of a peak hold circuit and an analog/digital (A/D) converter which are not depicted. The correlation coefficient between the detection signal DS of the integrator sensor 25 and the illuminance of the pulse illumination light on the surface of the wafer 14 has been determined beforehand and stored within the exposure controller 26. The detection signal DS of the integrator sensor 25 has been calibrated by means of a predetermined reference illuminance meter. In this embodiment, the integrator sensor 25 is used to indirectly measure the actual exposure quantity (irradiation energy per unit area per unit pulse) of the pulse illumination light in the irradiation field 12W.

During a scanning exposure operation, the exposure controller 26 supplies an emission trigger signal TS with a predetermined frequency to the excimer laser light source 1 so as to effect pulse emission and measures the fluctuation in light quantity of the pulse illumination light or the like from the detection signal DS from the integrator sensor 25. Also, it integrates the detection signals DS for the respective pulse illumination light components so as to successively determine the integrated exposure quantities at respective points on the wafer 14. Then, the exposure controller 26 adjusts the transmissivity values of the rough energy adjuster 3 and fine energy adjuster 4 such that thus integrated exposure quantity coincides with a set exposure quantity with respect to the photoresist on the wafer 14. Also, emission delay time Td of the excimer laser light source 1 has been measured beforehand and stored in a memory within the exposure controller 26. In response to this emission delay time Td, the exposure controller 26 adjusts the timing of the emission trigger signal TS or instructs the stage controller 17 to add a predetermined offset to the position of the XY stage 20 on the wafer side.

In the following, with reference to flow charts of FIGS. 1 and 2, explanation will be provided for an example of an operation in a case where the rough energy adjuster 3 in the projection exposure apparatus of this embodiment is changed over with respect to a plurality of shot areas on a single sheet of a wafer in an open loop control so as to effect an exposure operation with various integrated exposure quantities. In this example, the present invention is applied to a case where exposure is successively effected in a plurality of shot areas arranged in a matrix while the focus position of the wafer and integrated exposure quantity are gradually changed within their predetermined ranges in order to determine the best focus position and best integrated exposure quantity (set exposure quantity), namely, a case where the best focus position and best set exposure quantity are determined by test printing.

Figure 4:
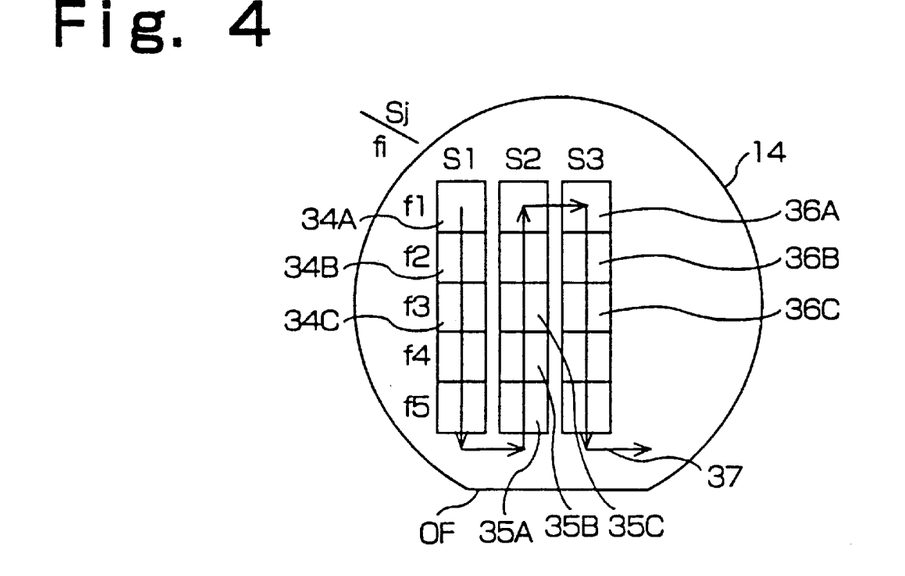
FIG. 4 is a plan view showing a shot arrangement at the time of test printing.

FIG. 4 shows the wafer 14 coated with a photoresist which is to be subjected to test printing in this embodiment. A method for subjecting this photoresist to test printing will be explained with reference to FIG. 8.

First, in FIG. 4, the exposure quantity is set to S1. This setting is controlled by a main control system MS. The main control system MS comprises a main controller MC constituted by a computer, a keyboard K as an input device, and a display D.

Figure 8:
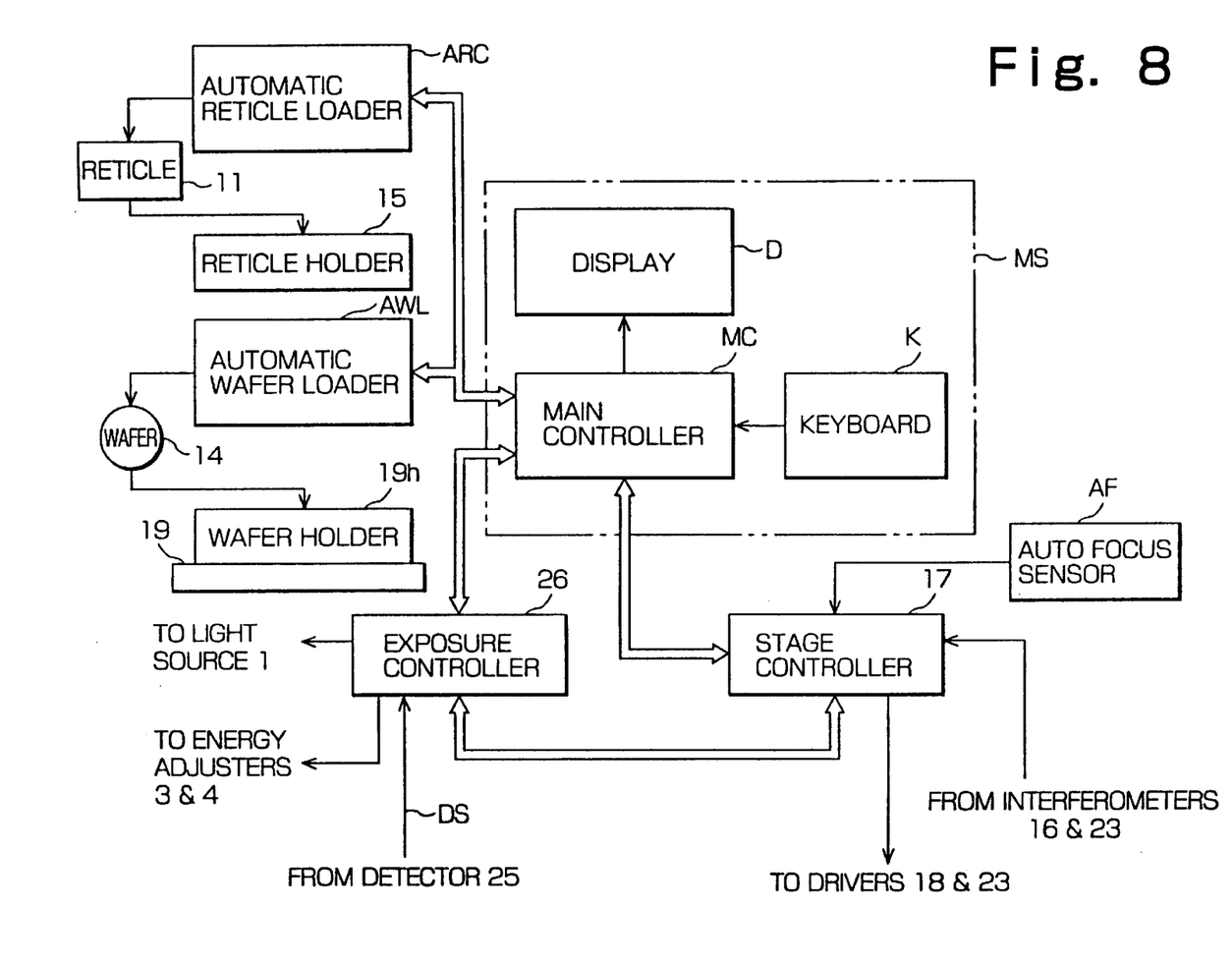
FIG. 8 is a block diagram showing an exposure apparatus.

When test printing is to be effected, first, the semiconductor wafer 14 which has been coated with a photoresist beforehand is prepared. This wafer 14 is accommodated in a wafer cassette (wafer carrier) which is not depicted. Then, this cassette is set in an automatic wafer loader AWL. When a wafer transfer command is input from the keyboard K to the main controller MC, the automatic wafer loader AWL transfers the wafer 14 within the cassette onto a wafer holder 19$h$ according to this instruction. Onto the wafer holder 19$h$, the wafer 14 mounted thereon is fixed by suction.

The main controller MC displays information such as an icon for test printing onto the display D. When the icon for test printing is selected by an input from the keyboard or when an execution command for test printing is input from the keyboard K, the main controller MC controls the exposure apparatus so as to effect test printing. A test printing operation is performed in the following manner.

The main controller MC controls an automatic reticle loader ARL so as to transfer a particular reticle 11 disposed within a reticle library (notdepicted) in the loader ARL to the reticle holder 15. Onto the reticle holder 15, the reticle 11 mounted thereon is fixed by suction. At this time, as the reticle 11 shown in FIG. 3 or FIG. 8, a reticle on which an evaluation pattern has been formed is used.

When the position of the best imaging surface of the projection optical system 13 and the position of the surface of the wafer 14 coincide with each other, an autofocus sensor AF outputs a signal indicative of an in-focus state to the stage controller 17. When the position of the best imaging surface of the projection optical system 13 and the position of the surface of the wafer 14 deviate from with each other, on the other hand, the autofocus sensor AF can output the amount of this deviation to the stage controller 17. Accordingly, when the stage controller 17 controls the stage 19 so as to change the height of the latter, the focus position can be changed. With respect to the configuration of this autofocus sensor AF, the disclosure of U.S. Pat. No. 4,908,656 is incorporated herein by reference.

When test printing is to be effected, the main controller MC sets exposure quantities S1, S2, and S3 to Sj (j being an integer). Here, the exposure quantity Sj+1 is defined as being smaller than the exposure quantity Sj. Also, the column direction is defined as a direction perpendicular to an orientation flat OF of the wafer, whereas the line direction is defined as a direction perpendicular to the column direction.

First, as shown in FIG. 4, the stage controller 17 controls each of the drivers 18 and 23 so as to move the reticle holder 15 and the stage 20 such that a part of an image of the reticle impinges on a first shot area 34A. Also, while monitoring the focus position output from the autofocus sensor AF, the stage controller 17 moves the Z stage 19 in Z direction such that the focus position becomes f1. Thereafter, the stage controller 17 controls each of the drivers 18 and 23 so as to move (scan) the reticle 11 and the wafer 14 in directions opposite to each other. The moving velocity of the reticle 11 is $V_R$, whereas that of the wafer 14 is $\beta V_R$. Here, each of these moving velocities is constant until the scanning of one column is completed. During this scanning operation, the main controller MC makes the exposure controller 26 perform an exposure operation with a set exposure quantity Sj. Namely, until the exposure quantity detected by the photo-detector 25 reaches the desired value Sj (j=1), the exposure controller 26 keeps inputting a trigger signal to the light source 1. In this manner, the stage controller 17 subjects the shot areas 34A, 34B, 34C, and so on in the first column on the surface of the wafer 14 to a scanning exposure type exposure operation with successively changing focus positions f1, f2, f3, and so on.

Then, with a set exposure quantity S2, the stage controller 17 subjects shot areas 35A, 35B, 35C, and so on in the second column along a pathway 37 to a scanning exposure type exposure operation with successively changing focus positions f5, f4, f3, and so on. Similarly, with respect to shot areas 36A, 36B, 36C, and so on in the third column and later, exposure operations are effected with the same set exposure amount for the same column while successively changing the focus positions. While there are two parameters of focus position fi (i=1, 2, . . .) and set exposure quantity Sj (j=1, 2, . . .) in this embodiment, the set exposure quantity, which takes time to change, is fixed for each column while the focus position fi is changed in each column. Accordingly, the time needed for the exposure operation is shortened.

Also, in the case where the set exposure quantity Sj is altered, even when the transmissivity of the rough energy adjuster 3 is switched over in an open loop control, the integrated exposure quantity cannot coincide with its set exposure quantity Sj with a predetermined accuracy and, accordingly, a desired exposure quantity target value accuracy cannot be attained. Accordingly, the following measures are taken.

First, the exposure controller 26 resets the rough energy adjuster 3 and the fine energy adjuster 4 so as to set their transmissivities to their respective maximum transmissivity values. Thereafter, the main controller MC of the main control system MS instructs, at step 101 in FIG. 1, the stage controller 17 about the focus position fi of the first shot area 34A on the wafer 14 and then instructs, at step 102 in FIG. 1, the exposure controller 26 about the set exposure quantity Sj with respect to this shot area 34A.

In this embodiment, the set exposure quantities Sj successively decrease (S1>S2>S3> . . . ), namely, are successively subjected to a higher sensitivity. At the first shot area 34A, the focus position is set to f1, while the set exposure quantity Sj is set to S1. In response thereto, the stage controller 17 sets the focus position of the wafer 14 to fi by means of the Z tilt stage 19. At subsequent step 103, the exposure controller 26 makes the excimer laser light source 1 perform a predetermined number of pulse emissions, while capturing the detection signal DS of the integrator sensor 25. Then, based on the detection signal DS of the integrator sensor 25, the exposure controller 26 indirectly computes a mean energy density (energy per unit pulse light per unit area) p of the pulse illumination light IL on the image surface. This process is called "energy check."

Thereafter, by using the set exposure quantity Sj and the energy density p, the exposure controller 26 computes exposure pulse number N from the following equation (step 104):

$$N=int(Sj/p) \quad (1)$$

wherein function int(a) is an integer not higher than a real number a.

Then, at step 105, this exposure pulse number N and a minimum exposure pulse number $N_{min}$ which has been determined so as to attain a desired reproducibility in exposure quantity control are compared with each other. When the exposure pulse number N is smaller than the minimum exposure pulse number $N_{min}$, the process proceeds to step 106, at which an ND filter having the maximum transmissivity within the range of $N \geq N_{min}$ is selected in the rough energy adjuster 3, and then energy check is performed again at step 103. Thereafter, when the condition of $N \geq N_{min}$ is attained at step 105, the process proceeds to step 107, at which it is further judged whether fine adjustment of energy by the fine energy adjuster 4 is necessary or not. Namely, exposure quantity target value accuracy $A_{tgt}$, which indicates the ratio of the error of the integrated exposure quantity obtained by the currently set extinction ratio to the set exposure quantity, is computed from the following equation:

$$A_{tgt}=ABS(1-p \cdot N/Sj) \quad (2)$$

wherein function ABS(a) indicates the absolute value of a real value a.

Then, when the exposure quantity target value accuracy $A_{tgt}$ is not lower than a desired exposure quantity target value accuracy A0 at step 108 in FIG. 2, the error in the integrated exposure quantity is so large that the operation proceeds to step 109, at which the extinction ratio Tf (also referred to as "degree of fine energy modulation" hereinafter) in the fine energy adjuster 4 in FIG. 3 is computed from the following equation and the extinction ratio of the fine energy adjuster 4 is set to Tf.

$$Tf=Sj/[p\{int(Sj/p)+1\}] \quad (3)$$

Then, at steps 110 to 112, by means of the rough energy adjuster 3 and fine energy adjuster 4 whose extinction ratios are respectively set as mentioned above, the first shot area 34A is subjected to a scanning exposure type exposure operation. When the exposure quantity target value accuracy $A_{tgt}$ is lower than the desired exposure quantity target value accuracy A0 at step 108, on the other hand, since no adjustment of extinction ratio is necessary, the process directly proceeds to steps 110 to 112 so as to effect the exposure operation. When there remains a shot area to be exposed to light in the same column on the wafer 14 at subsequent step 113, the XY stage 20 is driven at step 114 so as to set the next shot area to the scanning start position. Then, at step 115, the Z tilt stage 19 is driven so as to set the focus position fi of this shot area to its corresponding position. Subsequently, the process returns to steps 110 to 112 so as to perform a scanning exposure operation. After the foregoing operations are performed with respect to the shot areas in the same column on the wafer 14, the process shifts from step 113 to step 116, at which it is judged whether or not there is a next shot column on the wafer 14 to be exposed to light. When there is a shot column to be exposed to light, 1 is added to variable j at step 117. Then, at step 118, exposure pulse number N' with respect to the set exposure quantity Sj is computed from the following equation:

$$N'=int(Sj/p) \quad (4)$$

Figure 1:
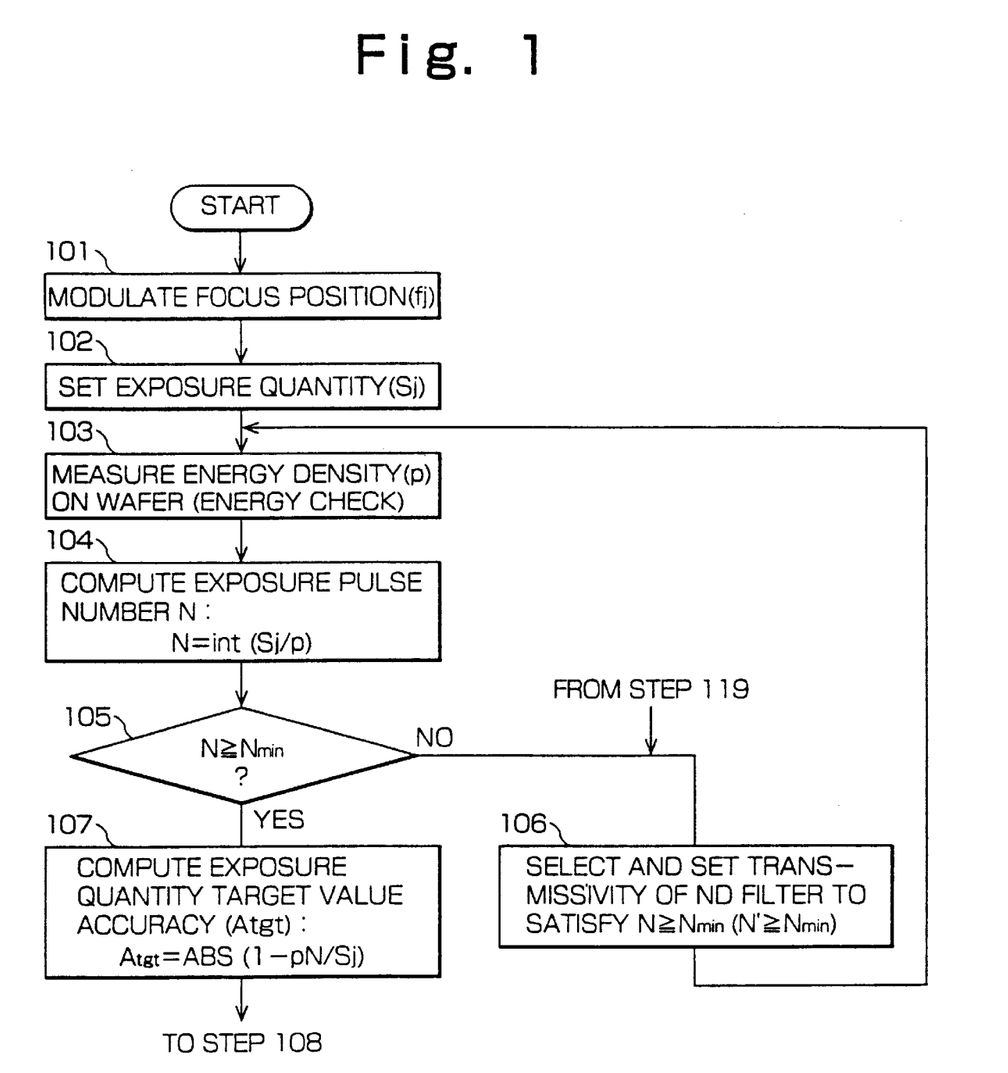
FIG. 1 is a flow chart showing a part of an exposure operation to which an embodiment of the exposure quantity control in accordance with the present invention is applied.

Thereafter, when this exposure pulse number N' is smaller than the minimum exposure pulse number $N_{min}$ at step 119, the process proceeds to step 106 in FIG. 1, at which an ND filter with a large extinction ratio is selected in the rough energy adjuster 3, and then the energy check is effected again at step 103. Thereafter, according to the aforesaid processes, with respect to the new exposure pulse number N, the ND filter in the rough energy adjuster 3 is selected so as to attain the condition of $N \geq N_{min}$, while the extinction ratio of the fine energy adjuster 4 is set such that the exposure quantity target value accuracy $A_{tgt}$ is lower than the desired exposure quantity target value accuracy A0, and then the next shot area is subjected to an exposure operation.

Figure 2:
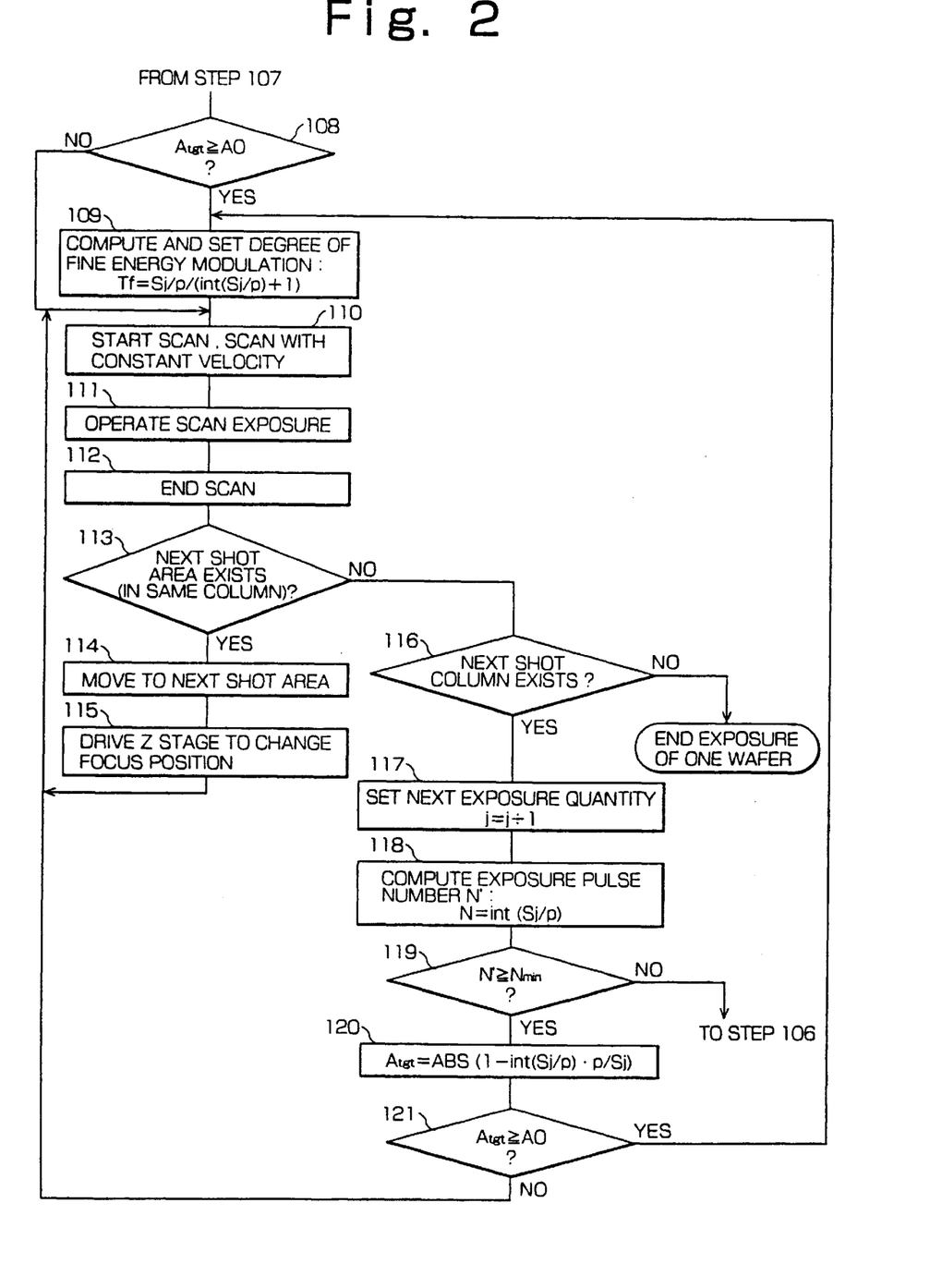
FIG. 2 is a flow chart showing an exposure operation subsequent to the exposure operation shown in FIG. 1.

When the condition of $N' \geq N_{min}$ is attained at step 119 in FIG. 2, on the other hand, the process proceeds to step 120, at which the exposure quantity target value accuracy $A_{tgt}$ is computed from the following equation:

$$A_{tgt} = ABS\{1 - int(Sj/p) \cdot p/Sj\} \tag{5}$$

Then, when the exposure quantity target value accuracy $A_{tgt}$ is not lower than the desired exposure quantity target value accuracy A0 at step 121, the process proceeds to step 109, at which the extinction ratio (degree of fine energy modulation) Tf is set to the value of equation (3) and then an exposure operation is effected at steps 110 to 112. When the exposure quantity target value accuracy $A_{tgt}$ is lower than the desired exposure quantity target value accuracy A0 at step 121, on the other hand, the process directly proceeds to steps 110 to 112 so as to effect an exposure operation since no adjustment of extinction ratio is necessary. Thus, when there is no next shot column at step 116, test printing is terminated. Thereafter, the wafer 14 is subjected to a development operation or the like so as to specify a shot area where a pattern with the best resolution is formed among all the shot areas. Then, the focus position and set exposure quantity used when this shot area was subjected to test printing are respectively determined as the best focus position and best set exposure quantity for the photoresist.

In this embodiment, as explained in the foregoing, when the selection of extinction ratio of the ND filter in the rough energy adjuster 3 is changed in an open loop control, the energy check is repeated as indicated by step 103 in FIG. 1. Accordingly, even when thus changed extinction ratio (=1-transmissivity) is different from that measured due to the positioning error of the ND filter or the like, the exposure quantity on the image surface (on the wafer) can be correctly determined, whereby the integrated exposure quantity at each shot area on the wafer 14 can correctly approximate its corresponding set exposure quantity. Also, as shown at step 109, when the extinction ratio of the fine energy adjuster 4, which can correctly set the extinction ratio even in an open loop control, is altered, the time required for test printing is reduced since no energy check is effected.

Normally, however, since throughput is not required so much for such test printing, energy check may be effected at each of times when the extinction ratio is altered in the fine energy adjuster 4, as shown at step 109, and in the rough energy adjuster 3. Namely, the process may always return to step 103 when the extinction ratio is altered.

Next, various methods for alleviating the influence of the emission delay time Td in the excimer laser light source 1 will be explained. The emission delay time Td in this embodiment is the time obtained when the delay time within the exposure controller 26, the communication time from the exposure controller 26 to the excimer laser light source 1, and the delay time within the excimer laser light source 1 are added together and can be considered substantially constant. So-called emission jitter, which is a fluctuation in the emission delay time Td, may cause, in conjunction with fluctuations in the scanning velocity, a fluctuation in synchronization, i.e., fluctuation in exposure quantity on the whole shot area surface. However, without this emission jitter being taken into account, measures against local fluctuations in exposure quantity which may occur at the first and last portions in each shot area due to the emission delay time Td will be considered here.

In FIG. 3, assuming that the scanning velocity of the wafer 14 in Y direction at the time of scanning exposure is V, the distance (referred to as "emission delay distance" hereinafter) by which the wafer 14 moves during the emission delay time Td in the excimer laser light source 1 is Td·V. Accordingly, in a first control method, the relative positions of the wafer 14 and irradiation field 12W in the scanning direction are corrected by this emission delay distance Td·V. Specifically, each of position (exposure start position) Ys of the wafer 14 in the scanning direction when the emission of the pulse illumination light IL is started and position (exposure end position) Ye of the wafer 14 in the scanning direction when the last emission of the pulse illumination IL is effected is shifted by the emission delay distance Td·V.

Figure 5A:
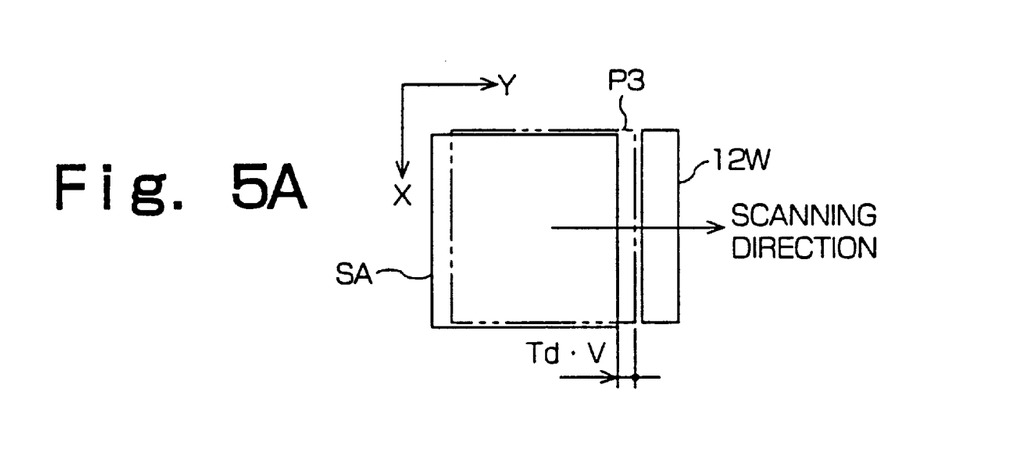
FIG. 5A is a plan view showing a case where the exposure start position in a certain shot area is shifted.

FIG. 5A shows the state in which, when a shot area SA on the wafer to be exposed to light is scanned in +Y direction with respect to a slit-like irradiation field 12W, the Y coordinate of the center of the shot area SA is placed at an exposure start position Ys'. In this drawing, with respect to an exposure start position P3 (whose Y coordinate is Ys) which is indicated by alternate dash and two short dashes line and in which the emission delay time is neglected, the position of the shot area SA is shifted in −Y direction by the emission delay distance Td·V. Namely, the following equation is established:

$$Ys' = Ys - Td \cdot V \tag{6}$$

Accordingly, since the shot area SA reaches the position P3 when the excimer laser light source 1 actually emits light, no fluctuation in integrated exposure quantity occurs at the exposure start portion in the shot area SA.

Similarly, when the exposure end position Ye' is shifted in +Y direction by the emission delay distance Td·V, namely, when the following condition is set with respect to the exposure end position Ye neglecting the emission delay time, no fluctuation in integrated exposure quantity occurs at the exposure end portion in the shot area SA.

$$Ye' = Ye + Td \cdot V \tag{7}$$

In FIG. 5A, such movement of the exposure start position or the like in the shot area SA is equivalent to the shifting of the irradiation field 12W in the opposite direction. Accordingly, without shifting the exposure start position or the like in each shot area, the position of the fixed irradiation stop 9 may be shifted in FIG. 3 so as to shift the position of the irradiation field 12W in Y direction toward +Y or −Y direction by the emission delay distance Td·V.

Figure 5B:
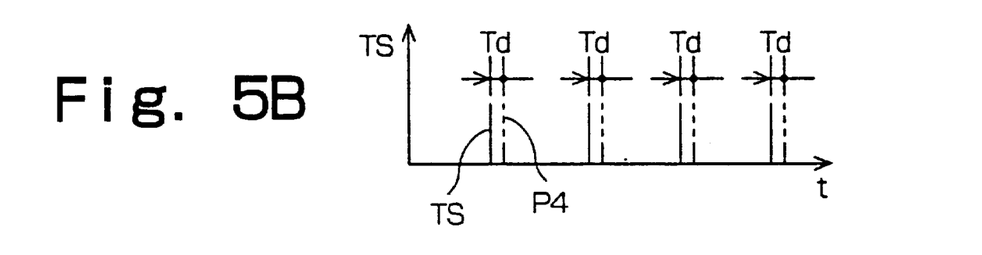
FIG. 5B is an explanatory view showing a case where timing of an emission trigger signal with respect to an excimer laser light source is shifted.

As a second control method, the influence of the emission delay time Td may be corrected in terms of time. Specifically, assuming that the expected time for starting exposure with respect to a certain shot area is $T_1$, the actual exposure start time is advanced to $(T_1 - Td)$. Also, assuming that the expected time for terminating exposure with respect to a certain shot area is $T_2'$, the actual exposure end time is set to $(T_2 + Td)$. These settings are equivalent to the case where the timing of each emission trigger signal TS output from the exposure controller 26 in FIG. 3 to the excimer laser light source 1 is advanced with respect to its position P4 neglecting the emission delay time by the emission delay time Td as shown in FIG. 5B. Accordingly, the integrated exposure quantity is prevented from fluctuating.

Further, as a third control method, the pulse illumination light near the time for starting the scanning exposure and that near the time for terminating the scanning exposure may have exposure quantities different from each other. In this case, for simplification, assuming that errors in integrated exposure quantity during when a certain shot area is exposed to light only occur at portions in this shot area where the first pulse of the pulse illumination light impinges and where the last pulse of the pulse illumination light impinges, in order to correct errors in the integrated exposure quantity, the exposure quantities of the first and last pulse components of the pulse illumination light are made greater than the exposure quantity of the other parts of the pulse illumination light by the amount of these errors.

Accordingly, the integrated exposure quantity is prevented from fluctuating at the exposure start portion and exposure end portion in the shot area. As a method for altering the pulse energy in the middle of a scanning exposure operation with respect to one shot area in this manner, the response speed of the fine energy adjuster 4 in FIG. 3 may be increased such that the energy is modulated by means of this fine energy adjuster 4. Alternatively, the power source voltage of the excimer laser light source may be modulated with a high speed so as to switch over energy per pulse.

Though the present invention is applied to the case where exposure quantity control is performed in a scanning exposure type projection exposure apparatus in the foregoing embodiments, the operation for effecting energy check when the extinction ratio of the rough energy adjuster 3 is altered can also be applied to the case where exposure quantity control is performed in a collective exposure type projection exposure apparatus such as a stepper.

Thus, without being restricted to the foregoing embodiments, the present invention can be configured in various manners as long as it does not deviate from the gist of the present invention.

In the following, the advantages of the present invention will be explained.

A projection exposure apparatus is used when semiconductor devices or the like are manufactured such that a pattern of a reticle, as a mask, is transferred under exposure light, by way of a projection optical system, to each shot area on a wafer (or glass plate or the like) coated with a photoresist. Such a projection exposure apparatus preferably has, as its basic function, an exposure quantity control function for maintaining, within an appropriate range, the integrated exposure quantity (integrated exposure energy) with respect to each point within each shot area of the wafer.

As the exposure quantity control in the collective exposure type projection exposure apparatus such as a stepper, in any case where a continuous light source such as a ultra-high pressure mercury lamp or a pulse laser light source such as an excimer laser light source is used as its exposure light source, cut-off control is desirable in principle. As an example of this cut-off control, during a wafer coated with a photosensitive material is irradiated with exposure light, a part of the exposure light may be branched out so as to be introduced to an integrator sensor composed of a photoelectric detector such that the exposure quantity on the wafer is indirectly detected by means of this integrator sensor while the emission is continued until the integrated value of the result of this detection exceeds a predetermined level (critical level) corresponding to the integrated exposure quantity (referred to as "set exposure quantity" hereinafter) necessary for the photosensitive material (closing of a shutter being started above the critical level in the case of continuous light).

Also, in the case where a pulse laser light source is used as the exposure light source, since the energy may fluctuate among a plurality of pulse laser light components, a desired reproducibility in exposure quantity control accuracy can be attained when the exposure operation is effected by at least a certain number (referred to as "minimum exposure pulse number" hereinafter) of pulse laser light components. In this case, when a highly sensitive resist is exposed to light, for example, since the set exposure quantity is small, the exposure operation cannot be effected with the minimum exposure pulse number or higher by using the laser light from the pulse laser light source as it is. Accordingly, when the set exposure quantity is small as mentioned above, it is preferable that the output of the pulse laser light source itself be lowered or the pulse laser light source be attenuated by an extinction means such as an energy modulator or the like disposed in the optical path, such that the exposure operation can be effected with the pulse number not lower than the minimum exposure pulse number.

On the other hand, a scanning exposure type exposure apparatus (scanning type exposure apparatus) such as that of a step and scan type which is comparable to the exposure apparatus of the present invention will be considered. It is assumed that an exposure quantity control operation regarding a single point on the wafer cannot be applied to this comparable scanning exposure type apparatus. The above-mentioned cut-off control operation cannot be applied to this case. Accordingly, as a first comparable control system, a system (open exposure quantity control system) in which the optical quantities of the individual illumination light components are integrated so as to control the exposure quantity may be considered. Also, as a second comparable control system, the integrated exposure quantity with respect to an area contained in an irradiation field (exposure area), which is formed like a slit with respect to the scanning direction, on the wafer may be measured in real time per pulse illumination light component so as to individually compute, based on this integrated exposure quantity, a target energy for the next pulse illumination light component, thereby controlling the energy of each pulse illumination light component (per pulse exposure quantity control system).

In these first and second comparable control systems, the former is a completely open loop control, whereas the latter is not completely closed as a control system. Here, "open loop control" refers to a control in which the energy adjustment is completed before exposure while, during the exposure, the energy of the pulse laser light is not modulated in the energy modulator within the illumination optical system and the laser light source which is the exposure light source. Here, though a high discharge voltage is finely controlled on the laser light source side to modulate energy in order to stabilize the output, the signal from the integrator sensor as an exposure quantity sensor is not fed back to this energy modulation. Accordingly, as the exposure quantity control, the first comparable control system can be considered an open loop control.

In such an open loop control, a control (exposure quantity target value control) for setting the integrated exposure quantity to a target value is effected on the basis of the mean energy of the pulse laser light measured by the energy measurement operation before exposure. When the energy modulation before exposure is to be effected, the current illuminance on the image surface is indirectly measured by the integrator sensor beforehand so as to compute and control, in response to the difference between the set exposure quantity and thus measured value, the extinction ratio of the energy modulator within the illumination optical system or the output of the laser light source. In such an exposure quantity target value control in the scanning exposure type projection exposure apparatus, not only the control accuracy of the energy modulator but also the recognition errors in the position and size of the slit-like irradiation field in the stage coordinates may influence the finally obtained exposure quantity. Such influences can be sufficiently suppressed when the position and size of the irradiation field are correctly measured.

Also, in the case where a continuous light source such as a mercury lamp is used as the exposure light source in a scanning exposure type apparatus, when a highly sensitive resist is used, unlike the case of the collective exposure type apparatus, it may be necessary to positively attenuate the illumination light.

Normally, the energy modulator within the projection exposure apparatus is constituted by a rough adjustment unit (rough energy adjuster) having a large modulation range and a fine adjustment unit (fine energy adjuster) for converting the exposure pulse number into an integer.

FIG. 6A shows an example of a rough adjustment unit in a comparative embodiment. In this drawing, for example, six pieces of ND filters 32A to 32F having transmissivities different from each other are fixed, with an identical angular distance therebetween, onto a revolver 31 which is rotatable around an axis 31a. The transmissivity values of the ND filters 32A to 32F have been measured beforehand. As the revolver 31 is rotated, an ND filter having a desired transmissivity can be set on an optical path of a pulse laser beam LB.

In general, however, when the exposure quantity is subjected to an open loop control based on a certain transmissivity, which has been measured beforehand, by means of such an ND filter, transmissivity may disadvantageously fluctuate in both long and short terms. As the causes for fluctuation in transmissivity in this ND filter, the local damage of the ND filter upon irradiation of intense laser light, the relative positional deviation of the ND filter and laser light with respect to each other based on the positioning error in the rotational angle of the revolver, and the like may be considered when an excimer laser light source is used as the exposure light source.

Figure 6B:
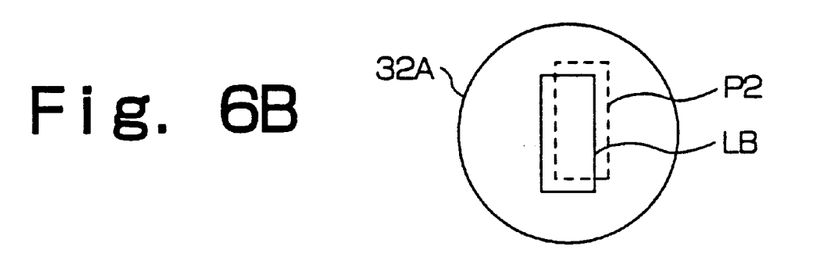
Figure 6C:
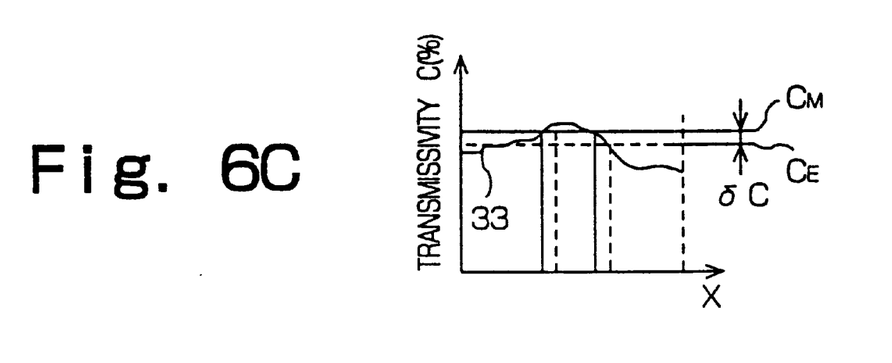

Namely, in the case where the ND filter 32A, for example, is set on the optical path of the pulse laser light LB as shown in FIG. 6A, when the position of the ND filter 32A deviates from its position P1 at the time of measurement of transmissivity due to the positioning error of the revolver 31, the position of the pulse laser light LB with respect to the ND filter 32A relatively shifts, in a transverse direction, from its position P2 at the time of measurement of transmissivity as shown by an enlarged view in FIG. 6B. Assuming that the position in the transverse direction is x, the distribution of transmissivity C [%] of the ND filter 32A at the position x fluctuates as indicated by curve 33 in FIG. 6C. Accordingly, assuming that the mean transmissivity at the time when the pulse laser light LB is placed at the position P2 is CE (transmissivity at the time of measurement), the actual mean transmissivity becomes CM (=CE+δC), namely, the transmissivity of the ND filter 32A changes by δC with respect to that at the time of measurement, whereby an error in energy modulation occurs in response thereto. In addition, a short-term fluctuation in the output energy of the excimer laser light source is equivalent to the change in transmissivity.

When a mercury lamp is used as the exposure light source, on the other hand, mainly due to thermal effects, the transmissivity of the ND filter may not have a stability sufficient for attaining a desired exposure quantity target value accuracy in a long term. When a plurality of shot areas on a wafer are successively exposed to light with the same exposure quantity in an actual lithography process, however, the exposure quantity with respect to the shot area immediately before the current operation may be monitored, for example, by an integrator sensor so as to correct the exposure quantities among shot operations on the basis of thus monitored result.

On the other hand, test printing may be performed in order to determine an appropriate exposure quantity to be supplied to the photoresist on the wafer. In this test printing operation, the respective exposure quantities with respect to a number of non-exposed shot areas are successively changed by a predetermined amount, whereby the exposure is effected, as a whole, with a wide range of exposure quantity. Also, though the exposure quantities are changed among shot operations, the standard for the exposure quantity is the actually measured value of the illuminance of the illumination light at the energy check performed before the first shot area is exposed to light. Then, since the exposure operation at the second shot area and later is performed while the extinction ratio in the energy modulator is changed in a completely open control, there is a disadvantage that it is difficult to correctly set the exposure quantity with respect to the second shot area or later to its target exposure quantity.

Next, when a pulse laser light source is used as the exposure light source, an emission trigger signal is supplied, for example, from an exposure controller to the pulse laser light source. Since a predetermined delay time (referred to as "emission delay time" hereinafter) Td actually exists between the time at which the emission trigger signal is supplied and the time at which the pulse laser light source emits light, however, assuming that the scanning velocity of the wafer is V, the exposure start position deviates in the stage coordinates by Td·V. Accordingly, there is a disadvantage in that an offset error in the exposure quantity occurs at the start and end portions for scanning exposure with respect to one shot area.

Figure 7A:
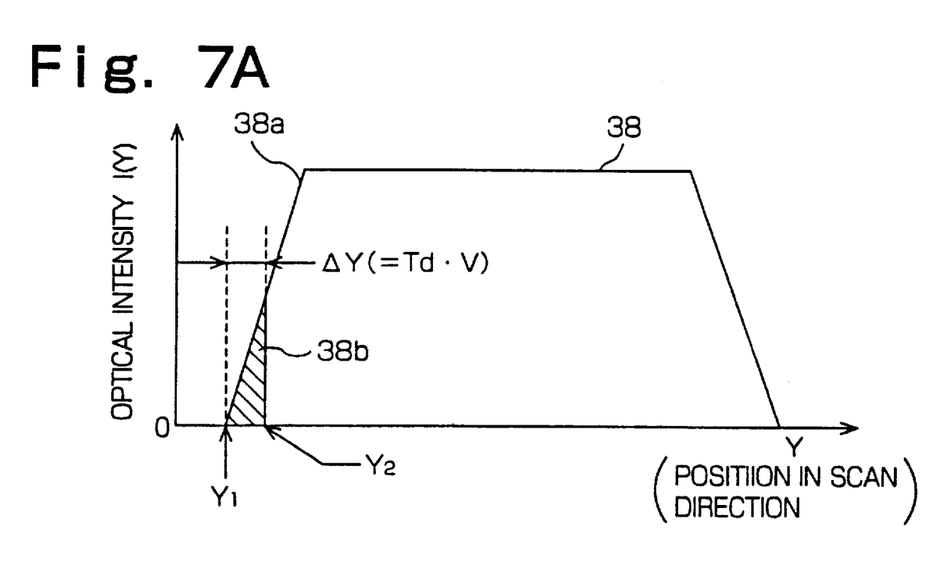
FIG. 7A is a chart showing an optical intensity distribution in a scanning direction within an irradiation field.
Figure 7B:
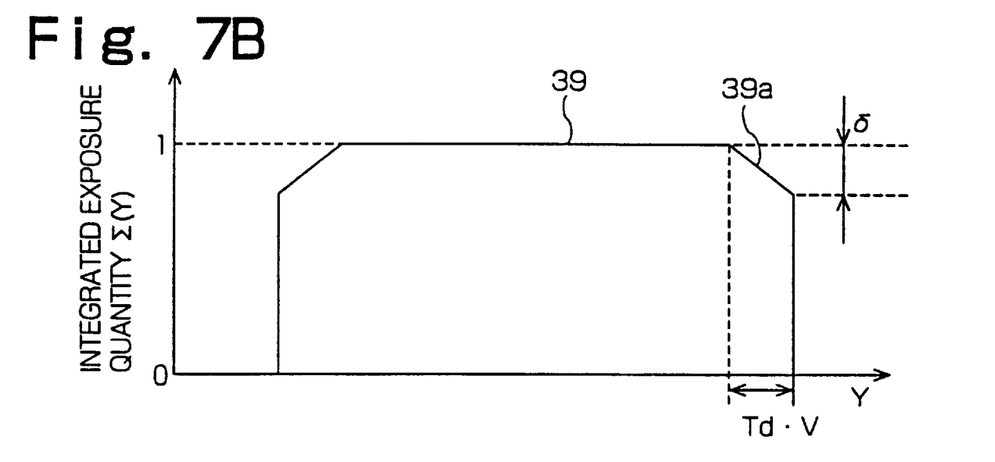
FIG. 7B is a chart showing fluctuation in integrated exposure quantity generated due to emission delay time.

FIGS. 7A and 7B are explanatory views showing how errors in exposure quantity occur due to the emission delay time Td. First, a polygonal line 38 in FIG. 7A indicates a distribution of optical intensity I(Y) in the scanning direction (defined as +Y direction) within an irradiation field on a wafer upon the first pulse laser light component immediately after the exposure is started. In this case, as the position of a field stop within the illumination optical system is slightly defocused from the conjugate surface with respect to the wafer surface, the optical intensity distribution in the irradiation field is shaped trapezoidal as indicated by a tilt portion 38a. In FIG. 7A, assuming that position $Y_1$ is the exposure start point recognized by the control system, actual exposure start point $Y_2$ is deviated from the position $Y_1$ by $\Delta Y$ (=Td·V) due to the emission delay time Td. As a result, the integrated exposure quantity at this exposure start point $Y_2$ when the exposure start point $Y_2$ has traversed the whole width of the irradiation field is smaller than the original integrated exposure quantity by an exposure quantity corresponding to the area of a hatched portion 38b. Similarly, the integrated exposure quantity at the exposure end point or end of the shot area decreases.

In FIG. 7B, a polygonal line 39 shows a distribution of integrated exposure quantity $\Sigma(Y)$ in the scanning direction (Y direction) on one shot area after the scanning exposure operation is terminated, while the set exposure quantity is set to 1. It can be seen from FIG. 7B that, due to the emission delay time Td, errors in integrated exposure quantity occur within a range with a width of Td·V extending from the exposure start position and within a range 39a with a width of Td·V extending to the exposure end position. Assuming that the maximum value of the error which can occur is δ, the exposure pulse number at each point on the wafer is N, the height of the hatched portion in FIG. 7A is h, the height of the trapezoidal line 38 is H, and the width of the irradiation field in the scanning direction is the width of the position in the trapezoidal line 38 at which the height is H/2, the maximum error value δ is expressed by the following equation:

$$\delta = h/(N \cdot H) \qquad (8)$$

In order to increase the throughput (number of sheets of wafers processed per unit time), the scanning velocity V of the wafer has to be increased. When the scanning velocity V is increased, however, it can be seen that the height h in equation (8) tends to increase, while the exposure pulse number N tends to decrease, thereby gradually increasing the maximum error value δ to a magnitude which cannot be neglected. Also, when the scanning velocity V becomes high, the range of the width Td·V within which the integrated exposure quantity has an error may disadvantageously increase.

In view of these problems, the present invention provides an exposure quantity control method in which the illuminance of the illumination light from the exposure light source is switched over in a plurality of steps in an open loop control, so that, when a plurality of shot areas on one sheet of a substrate to be exposed to light are exposed to light with various integrated exposure quantities, the exposure quantity with respect to each shot area can be correctly controlled.

Also, the present invention provides an exposure quantity control method which prevents the integrated exposure quantity on the substrate to be exposed to light from fluctuating in the case where pulse illumination light from a pulse light source is used to perform an exposure operation in a scanning exposure type apparatus even when the pulse light source has a predetermined emission delay time.

The first exposure quantity control method in accordance with the present invention is an exposure quantity control method in an exposure apparatus in which illumination light emitted from an exposure light source 1 illuminates a mask 11, in which a transfer pattern is formed, so as to transfer the pattern of the mask 11 onto a photosensitive substrate 14 under the illumination light. This method controls the exposure quantity of the illumination light with respect to the substrate 14. According to this method, an optical filter 3 having a variable attenuation factor for attenuating the illuminance of the illumination light in a plurality of steps is disposed between the exposure light source 1 and the mask 11. As the attenuation factor of this optical filter is switched over in an open loop control, the illuminance of the illumination light on the substrate 14 is controlled. When the attenuation factor in the optical filter 3 is switched over, the illuminance of the illumination light on the transfer surface for the pattern of the mask 11 is measured (e.g., indirectly by an integrator sensor 25) so as to control, based on the result of this measurement, the exposure quantity of the illumination light with respect to the substrate 14.

In accordance with the present invention, in the case where a plurality of shot areas in the substrate 14 are subjected to test printing with integrated exposure quantities different from each other, for example, when the attenuation factor at the optical filter 3 is switched over in an open loop control, the illuminance of the illumination light is actually measured on the transfer surface of the pattern of the mask 11 and, based on the result of this measurement, the illuminance is adjusted by a separate apparatus for finely controlling the attenuation factor, whereby the exposure quantity with respect to each shot area can be correctly controlled.

The second exposure quantity control method in accordance with the present invention is an exposure quantity control method in a scanning type exposure apparatus in which, while a part of a pattern on a mask 11 is projected onto a photosensitive substrate 14 under exposure pulse illumination light emitted from a pulse light source 1, the mask 11 and the substrate 14 are scanned in synchronization with each other so as to successively transfer the pattern of the mask 11 onto the substrate 14. This method controls the exposure quantity of the illumination light with respect to the substrate 14. According to this method, in response to an emission delay time between the time at which an emission trigger signal is supplied to the pulse light source 1 and the time at which the pulse light source 1 emits light, an offset is added to the relative position of an exposure area 12W on the substrate by the pulse illumination light and the substrate 14 with respect to each other in the scanning direction.

In the second exposure quantity control method in accordance with the present invention, assuming that the emission delay time of the pulse light source 1 is Td and the scanning velocity of the substrate 14 is V, as an offset of Td·V is added to the relative position of the exposure area 12W of the pulse illumination light and the substrate 14 with respect to each other, the integrated exposure quantity is prevented from fluctuating on the substrate 14 even when such an emission delay time exists.

The third exposure quantity control method in accordance with the present invention, in the prerequisite same as that of the second exposure quantity control method, in response to the emission delay time between the time at which an emission trigger signal is supplied to the pulse light source 1 and the time at which the pulse light source 1 emits light, an offset is added to the timing of the emission trigger signal supplied to the pulse light source 1. Accordingly, the pulse light source 1 can emit light at its original timing for emitting light, thereby preventing the integrated exposure quantity from fluctuating.

According to the first exposure quantity control method of the present invention, for example, when the attenuation factor (extinction ratio) in an optical filter is switched over in an open loop control so as to change over the illuminance of the illumination light in order to subject a plurality of shot areas on a photosensitive substrate to test printing or the like with various integrated exposure quantities, the illuminance of the illumination light on the transfer surface of the mask pattern is measured under thus changed condition. Accordingly, it is advantageous in that the integrated exposure quantity with respect to each shot area can be correctly adjusted to its desired value.

According to the second exposure quantity control method, on the other hand, in the case where a scanning exposure operation is effected with the pulse illumination light from the pulse light source, even when the pulse light source has a predetermined emission delay time, the positions of the exposure area and the substrate in the scanning direction are relatively shifted with respect to each other in response to this emission delay time. Accordingly, it is advantageous in that the integrated exposure quantity is prevented from fluctuating on this substrate (substrate to be exposed to light).

Also, according to the third exposure quantity control method, in the case where a scanning exposure operation is effected with the pulse illumination light from the pulse light source, even when the pulse light source has a predetermined emission delay time, the timing of the emission trigger signal supplied to the pulse light source is shifted in response to this emission delay time. Accordingly, it is advantageous in that the integrated exposure quantity is prevented from fluctuating on this substrate (substrate to be exposed to light).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.299478/1995 filed on Nov. 17, 1995 is hereby incorporated by reference.

What is claimed is:

1. A method for projecting a pattern formed by a mask onto a substrate by irradiating the mask with pulse light while simultaneously moving the mask and the substrate, comprising the steps of:

obtaining information on delay in luminescence of the pulse light; and adjusting a relative position of the substrate and exposure region on the substrate based on the information.

2. A method according to claim 1, wherein the luminescence timing of the pulse light is adjusted for the relative position.

3. A method according to claim 1, wherein the movement of the mask and the substrate relative to one another is adjusted for their relative positions.

4. A method according to claim 1, wherein a part of the intensity distribution of the pulse light on the substrate is graded.

5. A method according to claim 2, wherein a part of the intensity distribution of the pulse light on the substrate is graded.

6. A method according to claim 3, wherein a part of the intensity distribution of the pulse light on the substrate is graded.

7. A method for projecting a plurality of matrixed shots onto a substrate as a test exposure of a scanning type exposure apparatus, the scanning type exposure apparatus being an apparatus for illuminating a mask by illumination light while moving both of the mask and the substrate in synchronization, each of said shots being a pattern formed on the mask, said method being performed for determining a best focus and a proper amount of exposure by the scanning type exposure apparatus, said method comprising the steps of:

a) projecting a first shot array which includes a plurality of shots on the substrate by irradiating the substrate with the illumination light while changing the focus, the shots in the first shot array having a first amount of exposure;

b) determining a second amount of exposure after the step a), the second amount of exposure being used for projecting a second shot array which includes a plurality of shots on the substrate, the second shot array being different with respect to the first shot array; and c) projecting the second shot array on the substrate by irradiating the substrate with the illumination light while changing the focus, the shots in the second shot array having a second amount of exposure.

8. A method according to claim 7, wherein the illumination light includes pulse light, and wherein the second amount of exposure is determined by a step of adjusting at least a light energy of the pulse light or a number of pulses of the pulse light used in the step b).

9. A method according to claim 8, wherein the step b) further includes the following steps of:

b1) measuring an illumination intensity of the pulse light;

b2) calculating the number of pulses for exposure based on the illumination intensity measured in the step a) and the second amount of exposure;

b3) comparing the calculated number of pulses for exposure and a minimum number of pulses for exposure that satisfies a predetermined exposure reproducibility;

b4) changing the illumination intensity when the calculated number of pulses for exposure is smaller than the minimum number of pulses for exposure as a result of the comparison in the step b3); and b5) thereafter, repeating the steps b1) to b4) until the calculated number of pulses for exposure is greater than the minimum number of pulses for exposure.

10. A method according to claim 9, wherein the illumination intensity is changed in the step b4) so as to satisfy a condition that the calculated number of pulses for exposure is greater than the minimum number of pulses for exposure.

11. A method according to claim 9, wherein the scanning type exposure apparatus includes a changeable extinction ratio optical unit that attenuates the illumination intensity of the pulse light by a plurality of steps, and wherein the illumination intensity is changed by changing the extinction ratio of the changeable extinction ratio optical unit in the step b4).

12. A method according to claim 11, wherein the changeable extinction ratio optical unit includes a plurality of optical filters, and wherein the illumination intensity is changed by replacing the optical filters in the step b4).

* * * * *